United States Patent [19]

Vaughn

[11] Patent Number: 4,881,040
[45] Date of Patent: Nov. 14, 1989

[54] SIGNAL GENERATOR FOR PRODUCING ACCURATELY TIMED PULSE GROUPINGS

[75] Inventor: Charles J. Vaughn, Fremont, Calif.

[73] Assignee: GTE Government Systems Corporation, Stamford, Conn.

[21] Appl. No.: 228,158

[22] Filed: Aug. 4, 1988

[51] Int. Cl.$^4$ .................. H03K 5/04; H03K 5/135
[52] U.S. Cl. ...................................... 328/61; 328/58; 307/265; 307/271; 377/39; 377/56
[58] Field of Search .................. 307/265, 271; 377/20, 377/39, 56; 328/58, 61

[56] References Cited

U.S. PATENT DOCUMENTS

| | | | |
|---|---|---|---|
| 3,870,962 | 3/1975 | D'Errico | 307/271 |
| 4,049,953 | 9/1977 | Evans | 307/271 |
| 4,079,234 | 3/1978 | Kashio | 377/39 |
| 4,255,793 | 3/1981 | Nakamura | 307/271 |
| 4,330,751 | 5/1982 | Swain | 377/56 |
| 4,339,657 | 7/1982 | Larson et al. | 377/39 |
| 4,415,861 | 11/1983 | Palmquist et al. | 328/58 |
| 4,608,706 | 8/1986 | Chang et al. | 377/39 |
| 4,623,846 | 11/1986 | La Macchia | 328/61 |
| 4,754,163 | 6/1988 | Aue et al. | 307/265 |

*Primary Examiner*—John S. Heyman
*Attorney, Agent, or Firm*—Douglas M. Gilbert

[57] ABSTRACT

The pulse signal generator produces a repetitive pulse output signal consisting of repetitive pulse groups which may have either constant pulse intervals or staggered pulse intervals. Each pulse in the group also has an adjustable pulse width and may be time referenced to a clock pulse signal. The pulse generator employs cascaded stages of individual pulse generators: one stage for each pulse in the group. The first stage generates the first pulse in each group of n pulses and additionally controls the pulse group repetition interval and the pulse width of each pulse.

A first counter/comparator generates a first start-pulse, when it counts $N_1$ clock pulses. The start-pulse resets the first counter and triggers an output bistable (multivibrator) circuit, which initiates the leading edge of the first output pulse of the group. When $N_2$ clock pulses are registered by a second counter, its associated comparator generates an "end-pulse" to reset the second counter and trigger the bistable circuit a second time. The second change of state of the bistable circuit completes the first output pulse and also disables the second counter until another start-pulse retoggles the bistable circuit.

The pulse generator produces the other n−1 pulses by generating successive delay trigger pulses to retoggle the bistable circuit of the first stage. Other cascaded pulse generator stages produce the delayed trigger pulses. Each cascaded stage receives the first start-pulse signal and generates its own start-pulse signal a predetermined time interval, $\Delta t$, after receiving the first start-pulse. Each stage has a different programmed time interval $\Delta t$.

14 Claims, 5 Drawing Sheets

SIGNAL GENERATOR FOR PRODUCING ACCURATELY TIMED PULSE GROUPINGS

BACKGROUND OF THE INVENTION

1. Field of the Invention

The present invention relates generally to pulse generators and more particularly to a novel technique for generating a periodic digital waveform composed of accurately timed pulse groups.

2. Description of the Prior Art

In the electronics industry of today, pulse signal generators are indispensible test instruments used in many manufacturing and engineering applications. They are commercially available from many different sources although not always under the same generic name. Sometimes they are referred to as digital waveform generators, digital synthesizers, or pulse generators. Although commercial generators vary somewhat in the features offered, most models have the capability of producing pulse waveforms of variable pulse width (PW) and variable pulse repetition interval (PRI), and most have an accuracy to ±a few percent.

In the copending application Ser. No. 228,159 entitled "A DIGITAL PULSE GENERATOR HAVING A PROGRAMMABLE PULSE WIDTH AND A PULSE REPETITION INTERVAL" filed Aug. 4, 1988, which is incorporated herein by reference. a unique pulse generator is disclosed having capabilities beyond what is currently commercially available. One of the unique features of this generator is its ability to lock either the pulse width or the pulse repetition interval (or both) of the output pulse train to a precise reference oscillator preferably crystal controlled. In addition the generated pulses can be precisely set to almost any desired pulse width and any pulse repetition interval. Such a test waveform would be very useful in calibrating test instruments designed to measure such aspects of a repetitive digital signal. Unfortunately this generator can only produce single repetitive pulse signals, and there are instances where multiple pulse groupings are desirable. For example, in the design of radar receivers very precise adjustable pulse groupings are needed for test purposes.

An object of this invention is the provision of a pulse waveform generator capable of producing pulse groups having an adjustable pulse group repetition interval and adjustable pulse widths.

Another object of this invention is the provision of a pulse waveform generator capable of producing pulse groups whose time base is locked to a highly stable clock signal, such as a crystal controlled oscillator.

Still another object of this invention is the provision of a pulse waveform generator capable of producing groups of pulses having pulse repetition intervals and pulse widths which are independently programmable over a very wide range of values to an accuracy determined only by the time base accuracy of a reference clock signal.

BRIEF SUMMARY OF THE INVENTION

The above and other objects, advantages and capabilities are achieved in one aspect of the invention by a novel pulse generator which generates a repetitive pulse output signal consisting of repetitive pulse groups. Each group of "n" pulses has an adjustable pulse group repetition interval (PGRI) and each pulse in the group has an adjustable pulse width, both of which are time referenced to a reference clock pulse signal, $f_1(t)$, having a stable rep rate $f_c$. The pulse generator employs cascaded stages of individual pulse generators: one stage for each pulse in the group. The first such stage generates the first pulse in each group and additionally sets the pulse group repetition interval and the pulse width of each pulse. The first pulse generator uses two digitial counters to register the $f_1(t)$ clock pulses. As soon as the counters reach their programmed count, as determined by two associated digital comparators, a reset signal from the comparators resets the counters to zero. The first counter, which controls the PGRI, is free running and continually cycles between zero and a number of clock pulses $N_1$. Its associated comparator generates a "start-pulse," when $N_1$ clock pulses are counted. The start-pulse resets the first counter and triggers an output bistable (multivibrator) circuit, which initiates the leading edge of the first output pulse of the group. The change of state in the bistable circuit enables the second counter to begin counting. When the desired number of clock pulses $N_2$ are registered by the second counter, its comparator generates an "end-pulse" to reset the second counter and trigger the bistable circuit a second time. The second change of state of the bistable circuit completes the first output pulse and also disables the second counter until another pulse retoggles the bistable circuit. A first OR-gate, which may be considered as a part of the first pulse generator stage, gates the start-pulse from the first comparator along with delayed trigger pulses to the bistable circuit. The delayed trigger pulses are generated by other cascaded pulse generator stages. Each cascaded stage receives the first start-pulse signal and generates its own start-pulse signal a predetermined time interval, $\Delta t$, after receiving the first start-pulse. Each stage has a different programmed time interval $\Delta t$. Each successive delayed trigger pulse is coupled back through the OR-gate to retoggle the first bistable circuit. This in turn enables the second counter until its comparator generates another end-pulse to retoggle the bistable circuit and to complete the following output pulse signal thereby generating the successive pulses.

BRIEF DESCRIPTION OF THE DRAWINGS

For a better understanding of the invention as well as other objects and further features thereof, reference is made to the following description which is to be read in conjunction with the accompanying drawings wherein.

DETAILED DESCRIPTION OF THE INVENTION

Figure 1:
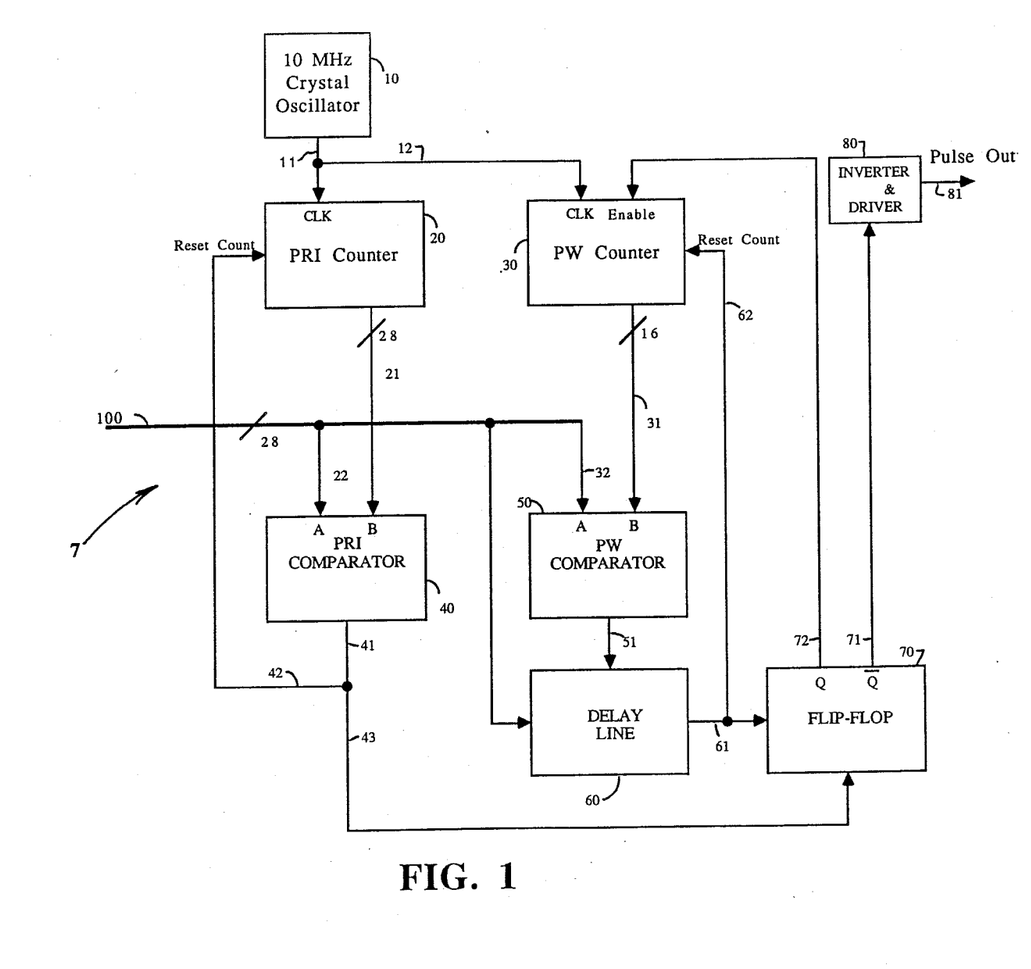
FIG. 1 is a schematic block diagram of a pulse generator with a crystal type base.
Figure 2:
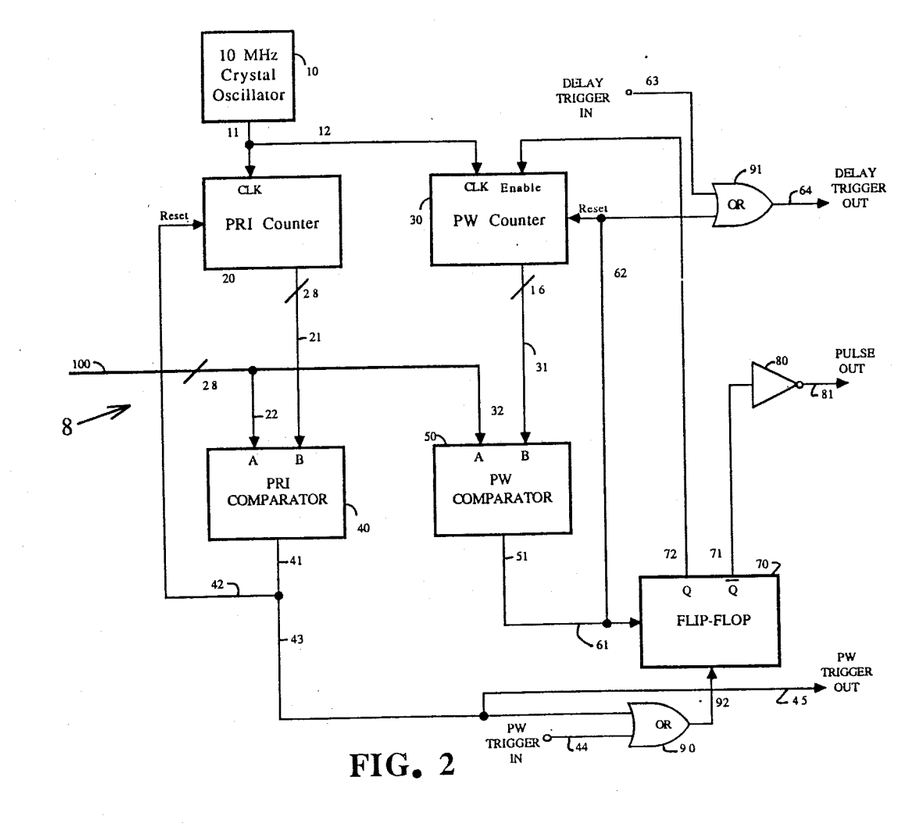
FIG. 2 is a schematic block diagram of the pulse generator shown in FIG. 1 with added gates to facilitate operation in a cascaded mode.

For a better understanding of the subject invention, reference is made to the following description and appended claims in conjunction with the above-described drawings. FIG. 1 illustrates in block diagram form the basic pulse generator 7 which was described in detail in the copending application referred to above. By adding two OR-gates 90 and 91 to the basic circuit, as shown in FIG. 2, the pulse generator may now be cascaded, much like a bit-slice microprocessor, to produce more than a repetitive single pulse waveform. More precisely, regular or staggered pulse groupings are possible by using additional pulse generator sections as delays to trigger the toggle circuit (flip-flop 70) of the first pulse generator. In the preferred embodiment, however, only one oscillator 10 is employed for all of the pulse generator stages to avoid the obvious problems inherent in frequency and phase locking two or more reference clock generators together. By using a single reference clock oscillator all of the pulse groups are precisely regulated to the same time base.

Figure 3:
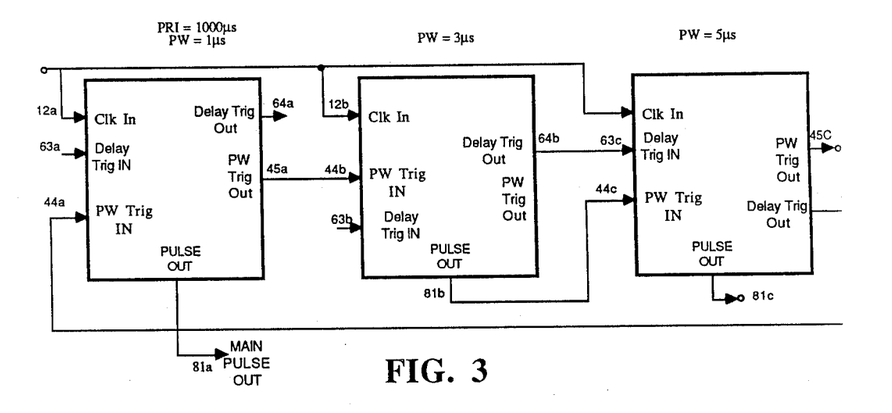
FIG. 3 is a schematic block diagram showing the interconnections of cascaded, pulse generators of the type shown in FIG. 2.

FIG. 3 illustrates in block diagram form three stages of the pulse generator 8 cascaded to form a generator having a three pulse-group repetitive output signal. FIG. 3 also illustrates the basic interconnections between the three pulse generator stages 8a, 8b and 8c which are shown in greater detail in FIG. 5. It is easiest to understand the functional operation of the three pulse-group generator by referring to the timing diagram shown in FIG. 4 in conjunction with the more detailed block diagram of FIG. 5.

Figure 4:
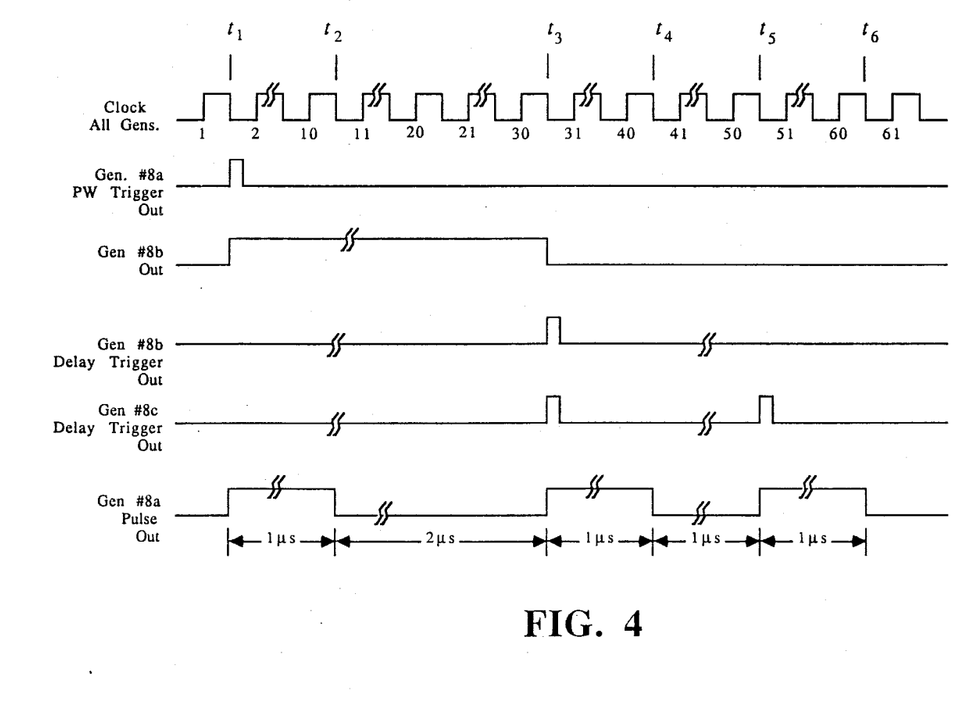
FIG. 4 is a timing diagram illustrating the operation of the pulse generator depicted in FIG. 3.
Figure 5:
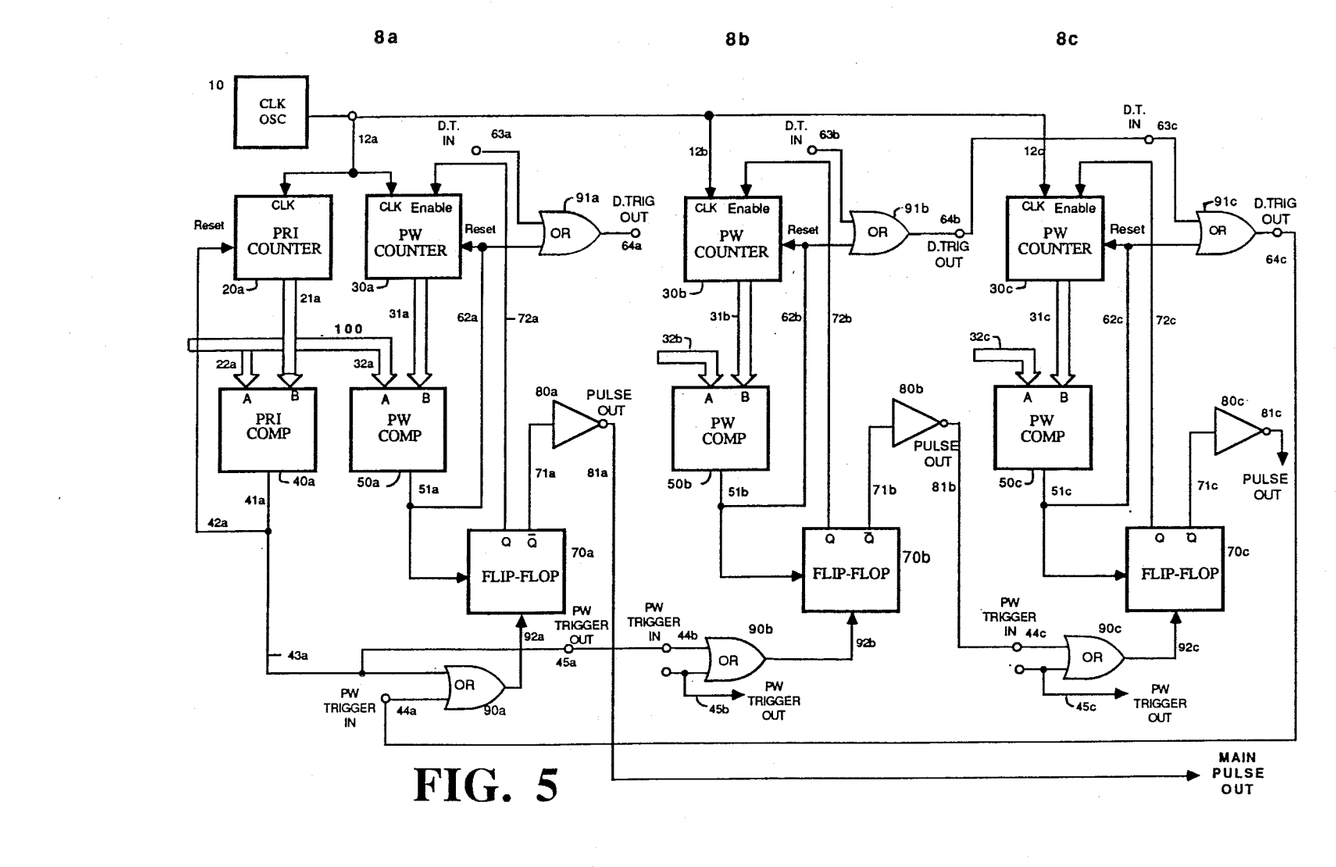
FIG. 5 is a more detailed schematic block diagram of the cascaded pulse generator shown generally in FIG. 3.

Generator 8a shown in FIGS. 3 and 5 consists of clock oscillator 10, PRI counter/comparator 20a and 40a, PW counter/comparator 30a and 50a, OR-gates 90a and 91a, J-K flip-flop 70a and line driver/inverter 80a. The other generators 8b and 8c are identical except that the oscillators are not used and the PRI counter/comparators are disabled and for simplicity are not shown in FIG. 5. For purposes of LSI fabrication it may be desirable from a wafer size perspective to exclude clock oscillator 10 and the PRI counter/comparator 20a/40a from the pulse generator stages to be iterated. If the entire circuit shown in FIG. 5 were placed on a single chip, it would probably be possible to eliminate several if not all of the line drivers/inverters 80, and use the Q output of each stage as the output interstage coupling point. The individual timing intervals of stages 8a, 8b, and 8c are established as explained in detail in the copending application. Briefly, for generator 8a, a BCD input signal on particular paths of data bus 100 independently sets both the pulse width interval and the pulse repetition interval of the output pulse stream by controlling the number of clock pulses N that are compared with the number of counted clock pulses. The other two comparators, 50b and 50c, are set in a similar manner. However, the PRI counter/comparator 20a/40a sets the pulse repetition interval of each pulse group (PGRI), and the PW counter/comparator 30a/50a sets the pulse width of each pulse in the group. The other PW counter/comparator's, 30b/50b and 30c/50c, set the time interval $\Delta t_1$, between the first start-pulse (from comparator 40a) and the second output pulse $t_3-t_1$: in FIG. 4, and also $\Delta t_2$ between the start-pulse and the third output pulse $t_5-t_1$: in FIG. 4, respectively. As a aid in understanding the functional operation of the circuit, the pulse groupings depicted by the pulse waveforms of FIG. 4 are generated by programming PW comparator 50b, via path 32b, for 30 clock pulses ($N_3$), PW comparator 50c, via path 32c, for 50 clock pulses ($N_4$), and PW comparator 50a, via path 32a, for 10 clock pulses ($N_2$). PRI comparator 40a is programmed via path 22a for 1000 clock pulses ($N_1$). For a clock rate $f_c$ of 10 Mb/s, the two generators 8b and 8c have a time delay interval ($\Delta t$) of 3 $\mu s$ and 5 $\mu s$, respectively. Generator 8a has a time interval of 1 $\mu s$ and its PRI counter/comparator 20a/40a is set to 100 $\mu s$ which is the pulse repetition interval of three-pulse group.

Referring to FIG. 4, the uppermost waveform is $f_1(t)$ which represents selected clock pulses from clock generator 10. The second waveform, Gen. 8a PW TRIGGER OUT, is the "first start-pulse signal" which is the output pulse signal from PRI Comparator 40a on path 41a at terminal 45a. The third waveform, Gen. 8b Out, represents the output pulse signal from line amp 80b (PULSE OUT) on path 81b. The fourth waveform, Gen. 8b DELAY TRIGGER OUT, is the "second start-pulse signal" which is the output pulse signal from OR-gate 91b on path 64b. The fifth waveform, Gen. 8c DELAY TRIGGER OUT, is the "third start-pulse signal" which is the output pulse signal from OR-gate 91c on path 64c. The sixth and bottom waveform, Gen. 8a PULSE OUT, represents the output pulse signal from line amp 80a (PULSE OUT) on path 81a.

Referring to both FIGS. 4 and 5, the output of PRI Comparator 40a connects to each of the flip-flops through OR-gates 90a and 90b and through amp 80b and OR-gate 90c; therefore, in the initial state of the generator, before the PRI comparator 40a produces an initial "start pulse," the Q output of all three flip-flops on paths 72a, 72b, and 72c is low ("0") which disables each of the three associated PW counters 30a, 30b and 30c. The first pulse of the main output signal occurs at time $t_1$ when PRI Comparator 40a registers state. This initial event occurs as soon as Counter 20a counts 1000 clock pulses (not shown in FIG. 4) which corresponds to the 100 $\mu s$ repetition interval of the pulse group. PRI Comparator 40a compares the two identical inputs at A and B and switches high ("1"), as shown by the single "PW Trigger Out" pulse in FIG. 4. This initial pulse (the first start-pulse) is fed back via path 42a to reset PRI Counter 20a and also, as will be seen, to trigger flip-flops 70a, 70b and 70c. This toggles the flip-flops forcing the Q outputs high which enables their associated PW Counters 30a, 30b, and 30c via paths 72a, 72b and 72c. The inverted $\overline{eQ}$ output of each flip-flop is re-inverted by line amp/inverter 80a and 80b, respectively (making the PULSE OUT signal identical to the Q output), so a "0" to "1" transition occurs at PULSE OUT, 81a, at time $t_1$ (bottom waveform of FIG. 4). In the second stage 8b, the Q output goes high to enable PW counter 30b which begins its count at $t_1$, and the PULSE OUT signal on path 81b also goes high to toggle flip-flop 70c via path 81b, OR-gate 90c and path 92c. And the Q output signal of flip-flop 70c (on path 72c) going high enables PW Counter 30c to begin counting. (In this three-pulse group example a fourth stage is not needed, therefore, the PULSE OUT terminal 81c is left open.) So, the start-pulse from generator 8a (second waveform) causes all three PW Counters 30a, 30b, and 30c to begin counting in sync with the start-pulse.

The next transition occurs at the end of 1 $\mu s$ which corresponds to 10 clock pulses. PW Comparator 50a is programmed via input 32a to count 10 clock pulses for the illustrative example chosen here. At $t_2$ PW Comparator 50a generates a single pulse (not shown in FIG. 4) to signal the end of the first pulse (hence designated the "end-pulse"), to retoggle flip-flop 70a and to reset PW Counter 30a. Flip-flop 70a changing states causes the MAIN PULSE OUT signal (on path 81a) to drop back to "0" thus completing the first 1 $\mu s$ pulse. The completion of this first output pulse has no effect on any of the subsequent generator stages.

At the end of 30 clock pulses, time $t_3$, PW Comparator 50b generates a single pulse (referred to herein as a second start-pulse since it signals the start of the second output pulse) on path 51b to reset its PW Counter 30b and to retoggle flip-flop 70b. Flip-flop 70b changing state causes its Q output to go low which immediately disables PW Counter 30b. Although this change of state removes the toggle pulse on path 92c, through line amp/inverter 80b and OR-gate 90c, this does not retoggle flip-flop 70c, since it is a "1" to "0" transition, and therefore, PW Counter 30c continues to count clock pulses. The reset pulse "1" on path 62b is sequentially gated through OR-gate 91b to the delay trigger input (D.T. IN) 63c, through OR-gate 91c to PW Trigger In 44a, and through OR-gate 90a to toggle flip-flop 70a. (See signal waveforms #4 and #5.) This change of state enables PW Counter 30a to begin a second 1µs count.

At the end of the second 1µs interval, time $t_4$, PW Comparator 50a generates a second end-pulse which resets PW Counter 30a to a zero count and retoggles flip-flop 70a. The change of state of 70a causes the MAIN PULSE OUT signal to drop back to zero thus completing the second pulse of the three-pulse group.

At the end of 50 clock pulses, time $t_5$, PW Comparator 50c generates a single pulse on path 51c to reset its associated PW Counter 30c and to retoggle flip-flop 70c. (See signal waveform #5.) Flip-flop 70c changing state causes its Q output to go low which immediately disables PW Counter 30c. The reset pulse "1" on path 62c is sequentially gated through OR-gate 91c back to PW Trigger In 44a, and through OR-gate 90a to toggle flip-flop 70a. This change of state enables PW Counter 30a to begin a third 1 µs count. At the end of the third 1 µs interval, $t_6$, PW Comparator 50a generates a third reset pulse which resets PW Counter 30 to a zero count, retoggles flip-flop 70a and disables Counter 30a. The change of state of flip-flop 70a causes the MAIN PULSE OUT signal to drop back to zero thus completing the third pulse of the three-pulse group. At this point all three PW Counters 30a, 30b and 30c are disabled and, PRI Counter 20a is the only counter operating. The next group of pulses will not begin until counter 20a has finished its PGRI count, i.e. 1000 clock pulses in this example.

Thus it can be seen that the pulse generator shown in FIG. 4 is capable of producing a repetitive pulse waveform consisting of pulse groups having a variable pulse group repetition interval with each pulse in the group having a variable pulse width but both referenced in time to whatever clock signal is desired. To vary the interval between the first and second output pulses (on path 81a), all that is necessary is to change the number of clock pulses set into comparator 50b, $N_3$, since that comparator controls the time interval ($t_3 - t_1$). To vary the interval between the second and third (or first and third) pulses, all that is necessary is to change the number of clock pulses set into comparator 50c, $N_4$, since that comparator controls the time interval ($t_5 - t_1$). And since $t_3$ and $t_5$ are programmable through data bus links 32b and 32c, respectively, the pulse intervals are similarly programmable. The pulse widths of all the pulses are similarly programmable via data bus 100 by setting the number of clock pulses in PW Comparator 50a, $N_2$. And lastly the pulse group repetition interval is programmable via data bus 100 by setting the number of clock pulses $N_1$ in PRI Comparator 40a. Because each of the comparators, and hence each respective time interval, is programmable, there are dynamic changes that are possible that may not be immediately obvious to those skilled in the art. For example, the pulse width interval is controlled by the number of clock pulses $N_2$ programmed into comparator 50a via bus 100. There is no reason $N_2$ could not be rapidly changed from one pulse group to another or even from one pulse to another in the same group. For example, the first pulse ($t_1$ to $t_2$) might be 1 µs long, the second pulse ($t_3$ to $t_4$) 1.5 µs long, and the third pulse ($t_5$ to $t_6$) 5 µs long. In other words, the PW of each pulse could be modulated in increments as small as the width of one clock pulse ($f_c$).

Certainly longer and other more complex pulse groupings are possible by cascading other stages of the pulse generator 8. Additional stages would be connected to stage 8c in the same manner stage 8b connects to 8c, i.e. DELAY TRIGGER OUT (64) to DELAY TRIGGER IN (63) and PULSE OUT (81) to PW TRIGGER IN (44). The final generator stage should always replicate stage 8c.

Although FIG. 5 shows various electrical circuits which are not really utilized, such as OR-gates 91a, 90b, and 90c, the three-pulse generator is shown in this manner to illustrate the cascaded sections. Obviously, it is possible to eliminate many of the components shown if desired.

While the invention has been shown and described with reference to its preferred embodiments, it will be understood by those skilled in the art that various changes may be made and equivalents may be substituted for elements thereof without departing from the true spirit and scope of the invention. In addition, many modifications may be made to adapt a particular situation to the teaching of the invention without departing from its essential teachings.

What is claimed is:

1. A pulse generator for producing a repetitive pulse output signal consisting of repetitive pulse groups, each group having as many as three pulses with predetermined pulse widths (PW), and each group having a predetermined/programmable pulse-group repetition interval (PGRI), both of which are time referenced to a clock pulse signal, $f_1(t)$, having a stable rep rate $f_c$, said pulse generator comprising:

first generator means (8a) for controlling the PGRI and the PW of each pulse in said group, said first generator section comprising:

first counter means (20a) for counting the number of clock pulses in said $f_1(t)$ and for generating a second digital signal, $f_2(t)$, directly related to the number of counted clock pulses, said counter means including first resetting means for resetting said first counter means to a zero count;

second counter means (30a) for counting the number of clock pulses in said $f_1(t)$ and for generating a third digital signal, $f_3(t)$, directly related to the number of counted clock pulses, said second counter means including second resetting means for resetting said second counter means to a zero count and first enabling means for enabling and disabling said second counter means;

first comparator means (40a) for receiving said $f_2(t)$ and for producing a first start-pulse signal at said pulse-group repetition interval by comparing the number of clock pulses represented by $f_2(t)$ with a first predetermined number $N_1$, where $N_1 = (PGRI)(f_c)$, said first start-pulse signal coupled to said first resetting means for resetting said first counter means;

second comparator means (50a) for receiving said $f_3(t)$ and for producing an end-pulse signal when the number of pulses represented by said $f_3(t)$ equals a second predetermined number, $N_2$, where $N_2 = (PW)(f_c)$, and where $N_2 < N_1$, said end-pulse signal coupled to said second resetting means for resetting said second counter means;

first gating means (90a) having a single output and a plurality of inputs, a first of said inputs for receiving said first start-pulse signal, said gating means performing an OR-gating function of said inputs and producing a gated start-pulse signal;

first bistable circuit means (70a) for receiving said gated start-pulse signal and for receiving said end-pulse signal, said first bistable circuit means producing said repetitive pulse output signal by generating a first output state when toggled by said gated start-pulse signal and by generating a second output state when toggled by end-pulse signal, said bistable circuit means thereby generating a single output pulse upon receiving said gated start-pulse signal followed by said end-pulse 47 signal; and, first coupling means (72a) for coupling said repetitive pulse output signal to said first enabling means for enabling said second counter means when said bistable circuit means is in said first output state and disabling said second counter means when said bistable circuit means is in said second output state; first delay trigger means (8b) for receiving said first start-pulse signal and for generating a second start-pulse signal a predetermined time interval, $\Delta t_1$, after said first start-pulse, such that $\Delta t_1 > PW$, said first delay trigger means including second coupling means (91b) for coupling said second start-pulse signal to a second input of said first gating means for toggling said first bistable circuit means, said first bistable circuit means thereby generating the second pulse of each pulse group in said repetitive pulse output signal;

second delay trigger means (8c) for receiving said first start-pulse signal and for generating a third start-pulse signal a predetermined time interval, $\Delta t_2$, after said first start-pulse, such that $\Delta t_2 > (\Delta t_1 + PW)$, said second delay trigger means including third coupling mens (91c) for coupling said third start-pulse signal to said second input of said first gating means for toggling said first bistable circuit means, said first bistable circuit means thereby generating the third pulse of each pulse group in said repetitive pulse output signal.

2. The pulse generator according to claim 1 in which said first delay trigger means (8b) further comprises:

third counter means (30b) for counting the number of clock pulses in said $f_1(t)$ and for generating a fourth digital signal, $f_4(t)$, directly related to the number of counted clock pulses, said third counter means including third resetting means for resetting said third counter means to a zero count and second enabling means for enabling and disabling said third counter means;

third comparator means (50b) for receiving said $f_4(t)$ and for producing a second start-pulse signal when the number of pulses represented by said $f_4(t)$ equals a third predetermined number, $N_3$, where $N_3 > N_2$, said second start-pulse signal coupled to said third resetting means for resetting said third counter means;

fourth coupling means (91b) for coupling said second start-pulse signal to a second input of said first gating means for toggling said first bistable circuit means, said first bistable circuit means hereby generating the second pulse of each pulse group in said repetitive pulse output signal;

second bistable circuit means (70b) for receiving said first start-pulse signal and for receiving said second start-pulse signal, said second bistable circuit means generating a first output state when toggled by said start-pulse signal and generating a second output state when toggled by said second start-pulse signal, said first and second output states coupled to said second enabling means for enabling said third counter means during said first output state and disabling said third counter means during said second output state.

3. The pulse generator according to claim 2 in which said second delay trigger means (8c) further comprises:

fourth counter means (30c) for counting the number of clock pulses in said $f_1(t)$ and for generating a fifth digital signal, $f_5(t)$, directly related to the number of counted clock pulses, said fourth counter means including fourth resetting means for resetting said fourth counter means to a zero count and third enabling means for enabling and disabling said fourth counter means;

fourth comparator means (50c) for receiving said $f_5(t)$ and for producing a third start-pulse signal when the number of pulses represented by said $f_5(t)$ equals a fourth predetermined number, $N_4$, where $N_4 > N_3$, said third start-pulse signal coupled to said fourth resetting means for resetting said fourth counter means;

fifth coupling means (91c) for coupling said third start-pulse signal to a second input of said first gating means for toggling said first bistable circuit means, said first bistable circuit means thereby generating the third pulse of each pulse group in said repetitive pulse output signal;

third bistable circuit means (70c) for receiving said first start-pulse signal and for receiving said third start-pulse signal, said third bistable circuit means generating a first output state when toggled by said start-pulse signal and generating a second output state when toggled by said third start-pulse signal, said first and second output states coupled to said third enabling means for enabling said fourth counter means during said first output state and disabling said fourth counter means during said second output state.

4. The pulse generator according to claim 3 in which each of said counter means further comprises a digital counter.

5. The pulse generator according to claim 4 in which each of said bistable circuit means comprises a J-K flip-flop having Q and $\overline{Q}$ outputs.

6. The pulse generator according to claim 5 further comprising a inverting line-amplifier connected to said $\overline{Q}$ output.

7. The pulse generator according to claim 5 in which said first gating means comprises an OR-gate.

8. The pulse generator according to claim 7 in which each of said comparator means comprises a BCD digital comparator circuit.

9. The pulse generator according to claim 8 in which said second digital signal is a BCD digital signal.

10. A pulse generator for producing a repetitive pulse signal consisting of repetitive pulse groups, each group having N periodic pulses with predetermined pulse widths (PW), and each group having an predetermined pulse-group repetition interval (PGRI), both of which are time referenced to a first digital clock pulse signal, $f_1(t)$, having a stable rep rate $f_c$, said pulse generator comprising:

first generator means for controlling the PGRI and the PW of each pulse in said group, and for generating the initial pulse of each pulse group, said first generator section comprising:

first counter means for counting the number of clock pulses in said $f_1(t)$ and for generating a second digital signal, $f_2(t)$, directly related to the number of counted clock pulses, said counter means including first resetting means for resetting said first counter means to a zero count;

second counter means for counting the number of lock pulses in said $f_1(t)$ and for generating a third digital signal, $f_3(t)$, directly related to the number of counted clock pulses, said second counter means including second resetting means for resetting said second counter means to a zero count and first enabling means for enabling and disabling said second counter means;

first comparator means for receiving said $f_2(t)$ and for producing a first start-pulse signal at said pulse-group repetition interval by comparing the number of clock pulses represented by $f_2(t)$ with a first predetermined integer $N_1$, where $N_1 = (PGRI)(f_c)$, said first start-pulse signal coupled to said first resetting means for resetting said first counter means;

second comparator means for receiving said $f_3(t)$ and for producing an end-pulse signal when the number of pulses represented by $f_3(t)$ equals a second predetermined integer, $N_2$, where $N_2 = (PW)(f_c)$, and where $N_2 < N_1$, said end-pulse signal coupled to said second resetting means for resetting said second counter means;

first gating means having a single output and a plurality of inputs, a first of said inputs for receiving said first start-pulse signal, said gating means performing an OR-gating function of said inputs and producing a gated start-pulse signal;

first bistable circuit means for receiving said gated start-pulse signal and for receiving said end-pulse signal, said first bistable circuit means producing said repetitive pulse output signal by generating a first output state when toggled by said gated start-pulse signal and by generating a second output state when toggled by said end-pulse signal, said bistable circuit means thereby generating a single output pulse upon receiving said gated start-pulse signal followed by said end-pulse signal; and, first coupling means for coupling said repetitive pulse output signal to said first enabling means for enabling said second counter means when said bistable circuit means is in said first output state and disabling said second counter means when said bistable circuit means is in said second output state;

a plurality of n delay trigger means for receiving said first start-pulse signal and for sequentially generating n start-pulse signals occurring at predetermined time intervals, $\Delta t_n$, following said first start-pulse such that $\Delta t_1 > PW$, said delay trigger means including second coupling means for coupling each of said n start-pulse signals to a second input of said first gating means for toggling said first bistable circuit means, said first bistable circuit means thereby generating sequentially each pulse in said repetitive pulse output signal.

11. The pulse generator according to claim 10 wherein said n delay trigger means further comprises:

$n+1^{st}$ counter means for counting the number of clock pulses in said $f_1(t)$ and for generating an $n+2^{nd}$ digital signal, $f_{n+2}(t)$, directly related to the number of counted clock pulses, said $n+1^{st}$ counter means including $n+1^{st}$ resetting means for resetting said $n+1^{st}$ counter means to a zero count and n enabling means for enabling and disabling said $n+1^{st}$ counter means;

$n+1^{st}$ comparator means for receiving said $f_{n+2}(t)$ and for producing an n start-pulse signal when the number of pulses represented by said $f_{n+2}(t)$ equals a predetermined number, $N_{n+1}$, where $N_{n+1} > N_n + PW$, said $n^{th}$ start-pulse signal coupled to said $n+1^{st}$ resetting means for resetting said $n+1^{st}$ counter means;

$n+3^{rd}$ coupling means for coupling said $n^{th}$ start-pulse signal to a second input of said first gating means for toggling said first bistable circuit means, said first bistable circuit means thereby generating the $n^{th}$ pulse of each pulse group in said repetitive pulse output signal;

$n^{th}$ bistable circuit means for receiving said first start-pulse signal and for receiving said $n^{th}$ start-pulse signal, said $n^{th}$ bistable circuit means generating a first output state when toggled by said start-pulse signal and generating a second output state when toggled by said $n^{th}$ start-pulse signal, said first and second output states coupled to said $n^{th}$ enabling means for enabling said $n+1^{st}$ counter means during said $n^{th}$ first output state and disabling said $n+1^{st}$ counter means during said second output state.

12. The pulse generator according to claim 11 in which each of said counter means further comprises a digital counter.

13. The pulse generator according to claim 11 in which each of said bistable circuit means comprises a J-K flip-flop having Q and $\overline{Q}$ outputs.

14. The pulse generator according to claim 13 further comprising an inverting line-amplifier connected to said $\overline{Q}$ output.

* * * * *